(12) United States Patent
Mainguet et al.

(10) Patent No.: US 10,719,685 B2
(45) Date of Patent: Jul. 21, 2020

(54) OLED-ILLUMINATED PRINT SENSOR

(71) Applicants: COMMISSARIAT À L'ÉNERGIE ATOMIQUE ET AUX ÉNERGIES ALTERNATIVES, Paris (FR); IDEMIA IDENTITY & SECURITY FRANCE, Issy-les-Moulineaux (FR)

(72) Inventors: Jean-François Mainguet, Grenoble (FR); Jérôme Boutet, Claix (FR); Joël Yann Fourre, Marly le Roi (FR); François Templier, Grenoble (FR)

(73) Assignees: COMMISSARIAT À L'ÉNERGIE ATOMIQUE ET AUX ÉNERGIES ALTERNATIVES, Paris (FR); IDEMIA IDENTITY & SECURITY FRANCE, Issy-les-Moulineaux (FR)

( * ) Notice: Subject to any disclaimer, the term of this patent is extended or adjusted under 35 U.S.C. 154(b) by 76 days.

(21) Appl. No.: 16/064,759

(22) PCT Filed: Dec. 21, 2016

(86) PCT No.: PCT/EP2016/082062
§ 371 (c)(1),
(2) Date: Jun. 21, 2018

(87) PCT Pub. No.: WO2017/108881
PCT Pub. Date: Jun. 29, 2017

(65) Prior Publication Data
US 2019/0005296 A1    Jan. 3, 2019

(30) Foreign Application Priority Data

Dec. 23, 2015 (FR) .................................... 15 63178

(51) Int. Cl.
*G06K 9/20* (2006.01)
*G06K 9/00* (2006.01)
(Continued)

(52) U.S. Cl.
CPC ......... *G06K 9/0004* (2013.01); *G06K 9/2027* (2013.01); *H01L 27/14678* (2013.01); *H01L 27/3234* (2013.01); *F21Y 2115/15* (2016.08)

(58) Field of Classification Search
CPC ............ G06K 9/0004; G06K 9/00006–9/0012
See application file for complete search history.

(56) References Cited

U.S. PATENT DOCUMENTS

2008/0317303 A1    12/2008  Konno et al.
2012/0256089 A1 *  10/2012  Kanda .................. G06K 9/0004
                                                    250/338.1
(Continued)

FOREIGN PATENT DOCUMENTS

JP          2003-037708 A       2/2003

OTHER PUBLICATIONS

U.S. Appl. No. 15/900,505; entitled "Print Sensor with Gallium Nitride LED," filed Feb. 20, 2018.
(Continued)

*Primary Examiner* — Brian Werner
(74) *Attorney, Agent, or Firm* — Pearne & Gordon LLP

(57) ABSTRACT

A papillary print sensor comprising in superposition a contact surface to which the print to be imaged is intended to be applied, an array optical sensor and illuminating device. The illuminating device is arranged between the contact surface and a detecting surface of the array optical sensor, and consists of a plurality of organic light-emitting diodes, referred to as OLEDs. Each OLED extends uninterruptedly over more than a third of a width (L1) of the detecting surface, and the OLEDs extend together along one or two series of patterns that are parallel to one another and distributed along the length (L2) of the detecting surface.

(Continued)

This configuration of the OLEDs allows in particular the transistors for controlling the OLEDs to be placed off the detecting surface (125).

14 Claims, 4 Drawing Sheets

(51) Int. Cl.
    *H01L 27/32*     (2006.01)
    *H01L 27/146*     (2006.01)
    *F21Y 115/15*     (2016.01)

(56) References Cited

U.S. PATENT DOCUMENTS

| | | | |
|---|---|---|---|
| 2015/0078636 A1* | 3/2015 | Carver | G06K 9/0004 382/124 |
| 2015/0191309 A1 | 7/2015 | Mainguet et al. | |
| 2016/0224819 A1* | 8/2016 | Kim | G06K 9/0004 |
| 2017/0010200 A1 | 1/2017 | Boutet et al. | |
| 2018/0032781 A1 | 2/2018 | Mainguet et al. | |
| 2018/0032782 A1 | 2/2018 | Mainguet et al. | |
| 2018/0068157 A1* | 3/2018 | Zeng | G06K 9/0008 |
| 2018/0357402 A1* | 12/2018 | Omata | A61B 5/1172 |

OTHER PUBLICATIONS

U.S. Appl. No. 15/922,204; entitled "Optical Imaging Device," filed Mar. 15, 2018.
International Search Report for International Application No. PCT/EP2016/082062, dated Feb. 17, 2017.
Written Opinion for International Application No. PCT/EP2016/082062, dated Feb. 17, 2017.
Preliminary French Search Report for Application No. FR 1563178, dated Sep. 20, 2016.

* cited by examiner

OLED-ILLUMINATED PRINT SENSOR

This is a National Stage application of PCT international application PCT/EP2016/082062, filed on Dec. 21, 2016, which claims the priority of French Patent Application No. 15 63178, filed Dec. 23, 2015, both of which are incorporated herein by reference in their entirety.

TECHNICAL FIELD

The invention relates to the field of sensors for imaging a print linked to the particular folds of the skin, in particular a fingerprint, but also a palm, foot, or phalange print. These various prints are designated together under the term papillary prints.

PRIOR ART

Various papillary print sensors are known in prior art, in particular sensors of the optical type, wherein the acquisition of an image of the print implements simply an illumination of the print then an image acquisition using a photosensitive component.

These sensors of the optical type generally have the form of a stack comprising a lower light-emitting layer, referred to as backlighting layer, a photodetector matrix, and where applicable a transparent protective layer on which the user has to position his finger.

An objective of this invention is to propose a papillary print sensor of the optical type, which makes it possible to obtain in fine an image with improved quality, compared to the devices of prior art.

DISCLOSURE OF THE INVENTION

This objective is achieved with a papillary print sensor comprising, in superposition, a contact surface to which the print to be imaged is intended to be applied, an array optical sensor (or matrix optical sensor), and illuminating means.

According to the invention, the illuminating means are arranged between said contact surface and a detecting surface of the array optical sensor.

They consist of a plurality of organic light-emitting diodes, referred to as OLEDs, each OLED extending uninterruptedly over more than a third of a width of said detecting surface, and the OLEDs extending together according to one or two series of patterns (or forms) that are parallel to one another and distributed over the length of the detecting surface.

According to the invention, the illuminating means are formed by OLEDs.

The general knowledge of those skilled in the art would have led to arranging OLEDs under the array optical sensor, forming the photosensitive component described in the introduction.

An idea at the base of the invention consists in noting that it is more advantageous to arrange the OLEDs above a detecting surface of the array optical sensor. This arrangement allows the OLEDs and the array optical sensor to be produced during the same manufacturing process, on a single substrate.

In order to provide increased illumination modularity, the illuminating means are formed by a plurality of light-emitting diodes. The general knowledge of those skilled in the art would have led to arranging the OLEDs in an array of OLEDs, according to a grid of several rows and several columns, with one OLED placed at each intersection of a row and a column. An OLED would have in particular been provided for each pixel of the array optical sensor.

The invention here proposes to overcome this prejudice. The OLEDs according to the invention therefore simply form one or two series of parallel patterns each formed uninterruptedly.

The OLEDs can thus be controlled from the edge of the papillary print sensor, without the means of control extending between two OLEDs, above the centre of the detecting surface.

Moreover, this configuration of the OLEDs in rows makes it possible to acquire different images of a papillary print, corresponding to the lighting of different series of rows of OLEDs, with these images able to be combined in order to obtain an image with improved quality.

Furthermore, the papillary print sensor does not require the use of microlenses arranged, in array form, between the contact surface and the array sensor, and this thus allows for the implementation of a compact sensor.

Preferably, each OLED is connected to a control unit, arranged to control the lighting and the extinguishing of the OLED, an orthogonal projection of the control units in the plane of the detecting surface being located outside said detecting surface.

A distance between the array optical sensor and the contact surface is advantageously less than 25 µm.

Such a distance provides the papillary print sensor with a large numerical aperture, and thus makes it possible to obtain images of prints, placed on the contact surface, that have an improved contrast.

Each OLED can extend uninterruptedly over more than 90% the width of said detecting surface, the OLEDs extending together according to a single series of patterns that are parallel to one another.

Preferably, the illuminating means are formed of OLEDs of different types, which differ by the central wavelength of the light radiation that they are adapted to emit.

The OLEDs can each comprise a spectral filter and together share the same organic semiconductor layer adapted to emit a multi-spectral radiation, and the various types of OLEDs may differ only by the central wavelength of the transmission band of the spectral filter.

Advantageously, each OLED has two separate central emission wavelengths, according to the value of a polarisation voltage that is applied to it, and the different types of OLEDs differ by the polarisation voltage supplied by a control unit connected to the OLED.

The organic light-emitting diodes include more preferably at least one first type of organic light-emitting diode, adapted to emit a light radiation with a central wavelength less than 590 nm, and a second type of organic light-emitting diode, adapted to emit a light radiation with a central wavelength greater than 600 nm.

The absorption by living tissue (in particular tissue of the skin) has a substantial variation at the wavelength of 600 nm, and it is as such possible to extract two substantially different pieces of information when a first type of organic light-emitting diode, adapted to emit a light radiation with a central wavelength less than 590 nm, and a second type of organic light-emitting diode, adapted to emit a light radiation with a central wavelength greater than 600 nm, are implemented.

Advantageously, the OLEDs comprise:
 a first type of OLED, adapted to emit a light radiation with
  a central wavelength between 400 and 495 nm, a second type of OLED, adapted to emit a light radiation with a central wavelength between 495 and 590 nm, and a third type of OLED, adapted to emit a light radiation with a central wavelength greater than 600 nm.

The OLEDs can together form a periodical arrangement, with a basic pattern that comprises said several types of OLEDs.

The OLEDs can together form a periodical arrangement, with a basic pattern such that the average repetition pitch of a type of OLED adapted to emit at a first wavelength is less than the average repetition pitch of a type of OLED adapted to emit at a second wavelength greater than the first wavelength.

Each OLED can have the form of a strip, with the OLEDs together forming strips parallel between them.

Preferably, each OLED extends above the array optical sensor, without covering the photosensitive areas of the pixels of the array optical sensor. The OLEDs are advantageously transparent and extend above the array optical sensor (120; 320) by covering the photosensitive areas of the pixels of said sensor.

Preferably, the OLEDs are regularly distributed along the length of the detecting surface of the array optical sensor, with a repetition pitch equal to the pixel pitch of the array optical sensor along said length.

BRIEF DESCRIPTION OF THE DRAWINGS

This invention shall be better understood when reading the description of embodiments given solely for the purposes of information and in no way limiting, in reference to the accompanying drawings wherein.

DETAILED DISCLOSURE OF PARTICULAR EMBODIMENTS

Figure 1A:
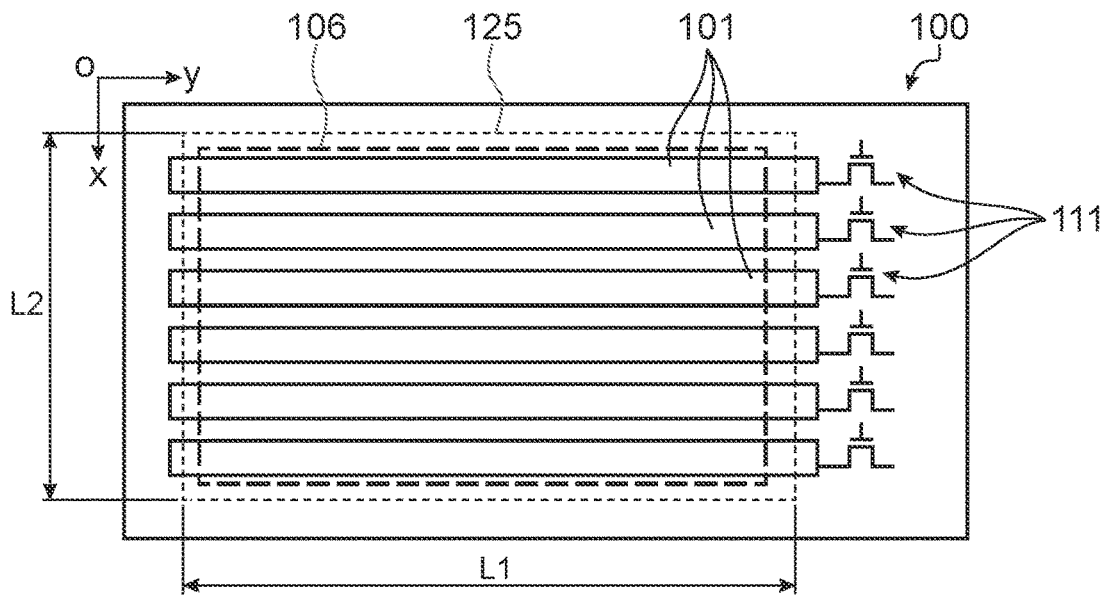
FIG. 1A diagrammatically shows a top view of a first embodiment of a papillary print sensor according to the invention.
Figure 1B:
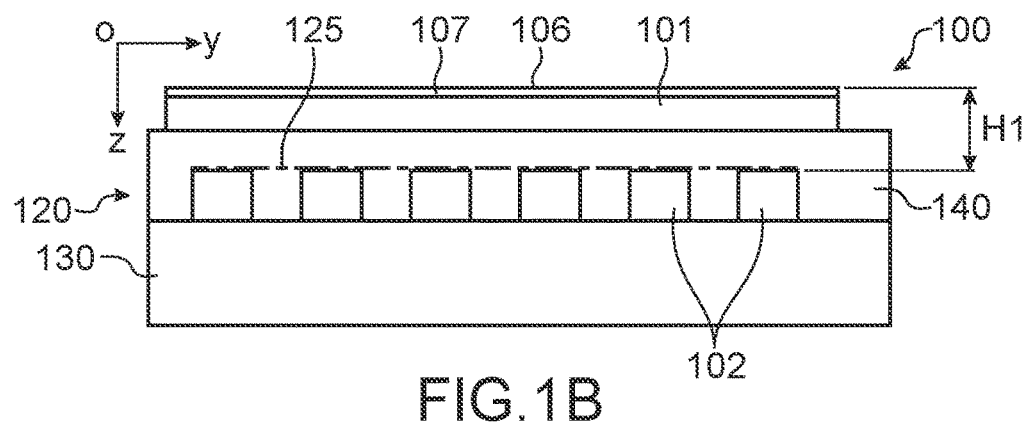
FIGS. 1B and 1C diagrammatically show cross-section views along two orthogonal axes, of the print sensor shown in FIG. 1A.
Figure 1C:
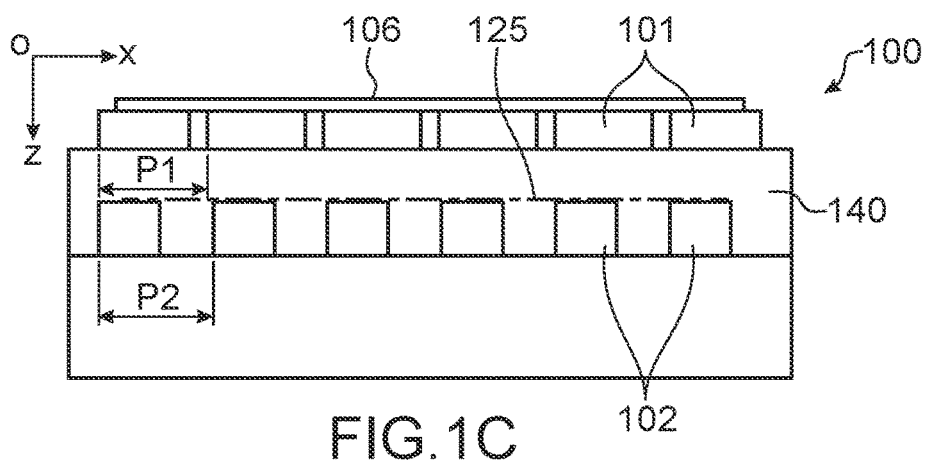

FIGS. 1A to 1C diagrammatically show a first embodiment of a papillary print sensor according to the invention. In what follows, it shall be considered, by way of example and in a non-limiting manner, that this is a fingerprint sensor 100.

FIG. 1A is a top view of this sensor, in a plane (XOY), while the FIGS. 1B and 1C are cross-section views respectively in a plane orthogonal to the plane (XOY) and parallel to the axis (OY), and in a plane orthogonal to the plane (XOY) and parallel to the axis (OX).

FIG. 1A more particularly shows the illuminating means of the sensor according to the invention, formed by light-emitting diodes 101, referred to as OLEDs for "Organic Light-Emitting Diode". The fingerprint sensor has for example more than ten OLEDs.

In all of the text, an OLED designates an organic light-emitting diode of which the lighting and the extinguishing are controlled by a difference in potential of about a few volts, between an upper electrode and a lower electrode framing a stack of organic semiconductor layer(s).

OLED technology offers in particular great flexibility in terms of sizing, emission wavelength, emission peak width, etc.

In particular, the OLEDs can have a repetition pitch less than 1 mm, even 500 µm or less. They can furthermore be very close to one another. For example, two neighbouring OLEDs can be spaced less than 10 µm from one another, even less than 5 µm, or even adjacent.

Another advantage is that they can be deposited at low temperature (about 80-100° C.), which does not imply any manifest incompatibility with other technologies implemented in the print sensor according to the invention.

The OLEDs 101 are arranged above an array optical sensor 120. In other terms, the illuminating means according to the invention and the array optical sensor are aligned along an axis (OZ) orthogonal to the plane (XOY).

The array optical sensor 120 is formed from a plurality of photodetectors 102 arranged according to a grid. The grid has more preferably a square mesh with N rows and M columns. Each photodetector 102 correspond to a pixel of the array optical sensor 102. FIG. 1B in particular shows a row of pixels of the array optical sensor 120. FIG. 1C in particular shows a column of pixels of the array optical sensor 120.

The extent of the rows defines the width L1 of the detecting surface 125 of the array optical sensor. The extent of the columns defines the length L2 of the detecting surface of the array optical sensor. The width L1 of the detecting surface 125 of the array optical sensor is aligned with the axis (OY). The length L2 of the fingerprint sensor 100 is aligned with the axis (OX). The largest side of the array optical sensor can be indifferently the length or the width. The pixel pitch of the array optical sensor is for example 50 µm, or 25 µm.

The detecting surface 125 is framed with a broken line in FIG. 1A, and symbolised by a mixed line in FIGS. 1B and 1C.

The photodetectors 102 are for example PiN diodes (for "P-Type Intrinsic N-Type") made from an inorganic material such as silicon for example. Alternatively, the photodetectors are organic photodetectors (referred to as OPD), or phototransistors, or any other photosensitive element.

Control units of these photodetectors are produced here using thin-film transistor technology, referred to as TFT, on a glass substrate 130.

The invention is of course not limited to this TFT technology. It can be transposed to other technologies, in particular CMOS technology (for "Complementary Metal-Oxide-Semiconductor") or even printed electronics. The substrate can be made from silicon, metal, plastic in particular to produce a flexible papillary print sensor, etc.

The array optical sensor 120 is configured to detect an optical signal emitted by the OLEDs 101 and backscattered on an obstacle, here a finger.

The OLEDs 101 are arranged above the array optical sensor 120.

In particular, the OLEDs are arranged on the side of the array optical sensor opposite the substrate 130, i.e. on the side of the detecting surface 125 of the array optical sensor 120. The detecting surface corresponds to the surface whereon the photodetectors 102 extend, in a plane parallel to the plane (XOY).

This arrangement makes it possible to favour the quantity of light arriving in the skin, in other terms the tissues, and to minimise the scattering of the light before reaching the papillary print.

There is little light that can go directly from the OLEDs to the pixels of the array optical sensor. And even if there were some, it would be sufficient to not use the pixels located directly under the lit OLEDs.

The OLEDs 101 share with the array optical sensor 120 the same substrate 130. In other terms, the OLEDs 101 and the array optical sensor 120 are integrated on the same substrate.

As such, the OLEDs and the array optical sensor can be produced during a single manufacturing process. In particular, instead of manufacturing one then the other on a dedicated substrate, then gluing them together, the array optical sensor can be carried out via deposition of layers on a substrate, then the OLEDs via deposition of layers directly above the same substrate.

In the example shown, a planarising layer 140 directly covers the photodetectors 102, with the OLEDs being deposited directly on this planarising layer.

In the first embodiment shown in FIGS. 1A to 1C, the OLEDs 101 extend uninterruptedly along (OY), substantially over the entire width L1 of the detecting surface 125 of the array optical sensor, for example at least 90% of this width.

In the example shown in FIGS. 1A to 1C, they extend even beyond the detecting surface of the array optical sensor, which has the advantage of limiting the edge effects on the images acquired. In other terms, they extend above said detecting surface, extending on either side from the latter in a plane (XOY).

Here, the OLEDs all have the same extent according to the axis (OY).

In the example shown in FIGS. 1A to 1C, they also have the same dimensions according to (OX) and (OZ).

They extend according to patterns that are parallel to one another, here according to strips parallel between them.

Alternatively, each pattern has the shape of a trapeze, or a zigzag in particular sinusoidal, or any other elongated shape according to (OY).

The patterns extend here parallel to them and parallel to the axis (OY), i.e. parallel to the rows of pixels of the array optical sensor.

Alternatively, the patterns can extend parallel between them and slightly inclined with respect to the axis (OY) and to the rows of pixels of the array optical sensor. This inclination, less than 8°, makes it possible in certain cases to improve the resolution of the images obtained.

The OLEDs 101 are distributed along the length L2 of the detecting surface 125 of the array optical sensor. They are therefore located one under the other in a plane parallel to the plane (XOY), with their ends being aligned on an axis parallel to (OX).

They are therefore distributed here over a surface with dimensions greater than or equal to those of the detecting surface 125 of the array optical sensor.

The OLEDs are distributed here regularly along the length L2 of the detecting surface 125 of the array optical sensor, with a repetition pitch P1 equal to the pixel pitch of the array optical sensor along the axis (OX).

Each OLED is connected to a control unit 111, configured to control the lighting and the extinguishing of each OLED according to an addressing principle that can be found in technology of the AMOLED type (for "Active Matrix OLED").

The control units 111 extend fully outside the detecting surface 125, along a side of the latter, parallel to (OX).

Each control unit 111 comprises at least one transistor, formed here on the substrate 130, at the periphery of the array optical sensor. On the gate of each transistor, control drivers can be connected, for example to control predetermined lighting and extinguishing sequences.

The control units 111 are aligned one after the other along the axis (OX), i.e. along an axis orthogonal to the axis of elongation of the OLEDs.

The control units 111 are placed on one side of an OLED, according to its axis of elongation, on both sides of an OLED according to its axis of elongation, or distributed between the both (which makes it possible to limit their repetition pitch on each side of the OLEDs).

Here, the transistors are produced with TFT technology, and produced at the same time as the transistors required for the operation of the array optical sensor.

Alternatively, the control units are not produced on the substrate 130, but offset from the latter, and connected at the periphery of the latter to an electrical contact connected to an OLED. They are for example produce using CMOS technology, connected and where applicable fixed at the periphery of the substrate 130. Here again, they extend fully outside the detecting surface 125.

In the AMOLED arrays of prior art, the OLEDs are formed according to an array with several rows and several columns, and each control unit is arranged in the vicinity of the corresponding OLED, inside the OLED grid. With such an AMOLED array, the control units would therefore extend inside the detecting surface 125.

When the control units are produce on the same substrate with the array optical sensor, the invention therefore makes it possible to release, at the centre of the detecting surface, slots for transistors dedicated to the array optical sensor and not to the controlling of the OLEDs.

During operation, the user places the finger directly on the fingerprint sensor, in direct physical contact with a contact surface 106 of the latter. The skin (or at least the skin of the ridges of the papillary print) is therefore in direct contact with the contact surface 106.

The contact surface 106 is a portion of the external surface of the array optical sensor, located above the OLEDs and the array optical sensor.

The contact surface 106 can belong to the upper surface of a thin protective layer 107 that covers the OLEDs.

Alternatively, the contact surface simply belongs to an upper electrode that covers the OLEDs.

The contact surface 106 is preferably flat, parallel to the plane (XOY).

Where applicable, interstices between neighbouring OLEDs are filled in with a transparent material.

In order to limit scattering effects between the finger and the array optical sensor, the distance H1 between the latter and the contact surface 106 has to be reduced, for example less than 25 μm, preferably between 1 μm and 20 μm.

The height H1 is measured along (OZ), between the plane receiving the tops of the photodetectors 102, and the plane receiving the tops of the contact surface, with the tops of the contact surface being located above the OLEDs.

The OLEDs are inserted into this space of height H1. Consequently, the thickness of the OLEDs according to (OZ) is advantageously less than 25 μm and even 20 μm.

For reasons of legibility of the figures, the contact surface is not necessarily shown in the following figures.

During operation, all of the OLEDs are not lit simultaneously, and it is possible to process only the pixels of the array optical sensor that are not located directly under a lit OLED.

The papillary print sensor according to this invention does not require the use of microlenses arranged, in the form of an array, between the contact surface and the array sensor. It is as such possible to consider a device that is more compact, which also makes it possible to obtain images of papillary prints with better contrast. In particular, a distance H1 less than 25 μm makes it possible to increase the numerical aperture of the sensor according to this invention.

Figure 2:
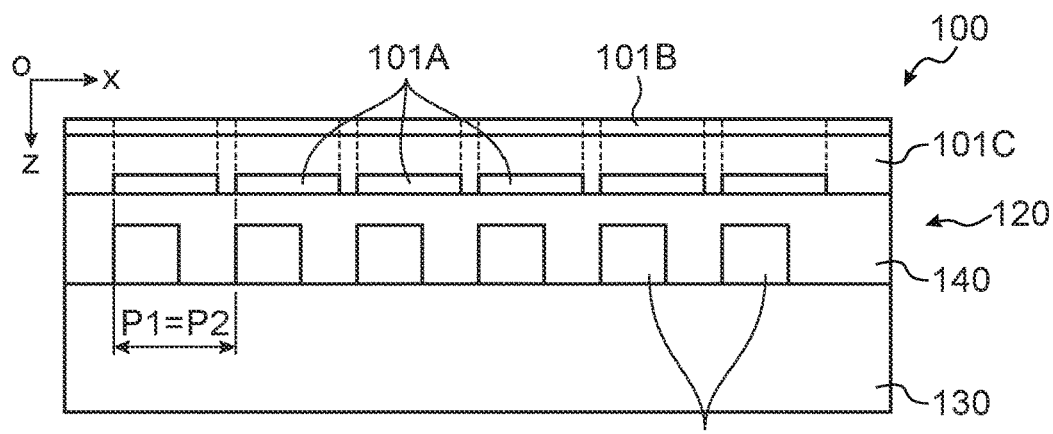
FIG. 2 shows an example of a papillary print sensor such as shown diagrammatically in FIGS. 1A to 1C.

FIG. 2 shows with somewhat more detail the fingerprint sensor 100, according to a cross-section view, along the same plane as in FIG. 1C.

Each OLED 101 is defined by the intersection between:
a lower electrode 101A, specific to said OLED (on the side of the substrate 130);
an upper electrode 101B, common to all of the OLEDs, which extends uninterruptedly above the detecting surface of the array optical sensor 120 (the farthest electrode from the substrate 130); and
a stack 101C of at least one organic semiconductor layer, common to all the OLEDs, which extends uninterruptedly above the detecting surface of the array optical sensor 120.

Each OLED according to the invention is therefore defined by the intersection between the upper electrode, a lower electrode, and the stack of at least one organic semiconductor layer.

In particular, the extent of an OLED in a plane parallel to the plane (XOY) corresponds to the intersection between the projection in this plane of the upper electrode, the projection in this plane of a lower electrode, and the projection in this plane of said stack.

The limits of each OLED are represented as a dotted line.

The lateral dimensions of a OLED are here defined by the extent of the lower electrode 101A in the plane (XOY), which gives access to small dimensions of the OLEDs according to (OX), for example less than 20 μm, in particular 10 μm. Furthermore, the spatial constraints during the deposition of the stack 101C are reduced.

The whole is covered with a protective layer, also called an encapsulation layer, not shown. The upper surface of this protective layer forms the external surface of the fingerprint sensor, comprising the contact surface whereon the user places his finger for the reading of the print.

The stack 101C which extends full layer above the array optical sensor 120, is transparent over an emission spectral band of the OLED. The transmission coefficient on this spectral band is for example greater than 70%. It can be greater than 70%, between 450 and 750 nm.

The same applies for the upper electrode 101B, which can be a thin metal or ITO (Indium tin oxide).

According to an alternative not shown, the stack of at least one organic semiconductor layer is specific to each OLED. The stacks of several OLED are carried out for example by deposition of a layer through a mask.

The lower electrodes 101A are opaque at the emission wavelength of the OLED (transmission coefficient for example less than 30% between 450 and 750 nm). This prevents the emission of light provided by the OLED from being directly emitted to the array optical sensor, without reflecting on the print to be imaged. However, it can be tolerated that the pixel under the OLED be blinded, since in operation all of the OLEDs will not be lit simultaneously. It is possible to increase the output of an OLED with lower reflective electrodes 101, for example with a reflection coefficient greater than 70% between 450 and 750 nm.

In the example shown in FIG. 2, the repetition pitch of the OLEDs is constant, and equal to the pixel pitch of the array optical sensor along (OX).

In other terms, to each OLED corresponds a row of pixels of the array optical sensor 120.

Figure 3:
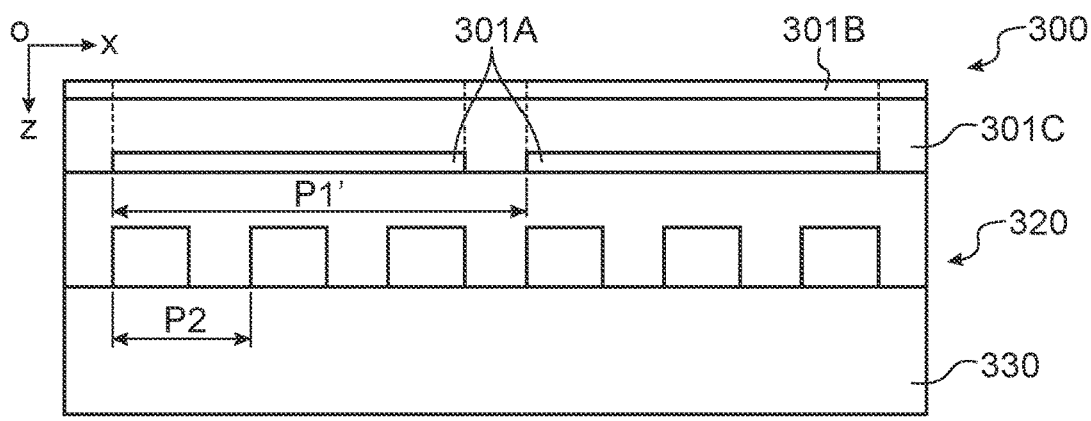
FIG. 3 shows a second embodiment of a papillary print sensor according to the invention.

FIG. 3 shows an alternative wherein the repetition pitch P1' of the OLEDs is constant, and different from the pixel pitch P2 pixel of the array optical sensor along (OX).

The numerical references of FIG. 3 correspond to those of FIG. 1, with the first digit replaced with a 3.

In particular, the repetition pitch P1' is an integer multiple of P2. For example P2 is about 50 μm, even 25 μm, and PV is between 10 and 20 times greater, for example of about 500 μm, more preferably less than one millimetre.

Each OLED can then extend above several rows of pixels of the array optical sensor 320.

The various OLEDs can be close to one another. For example, the neighbouring edges of two neighbouring OLEDs are spaced apart by a distance less than the width of a pixel of the array optical sensor along the axis (OX), in particular less than 25 μm or even 10 μm.

Figure 4:
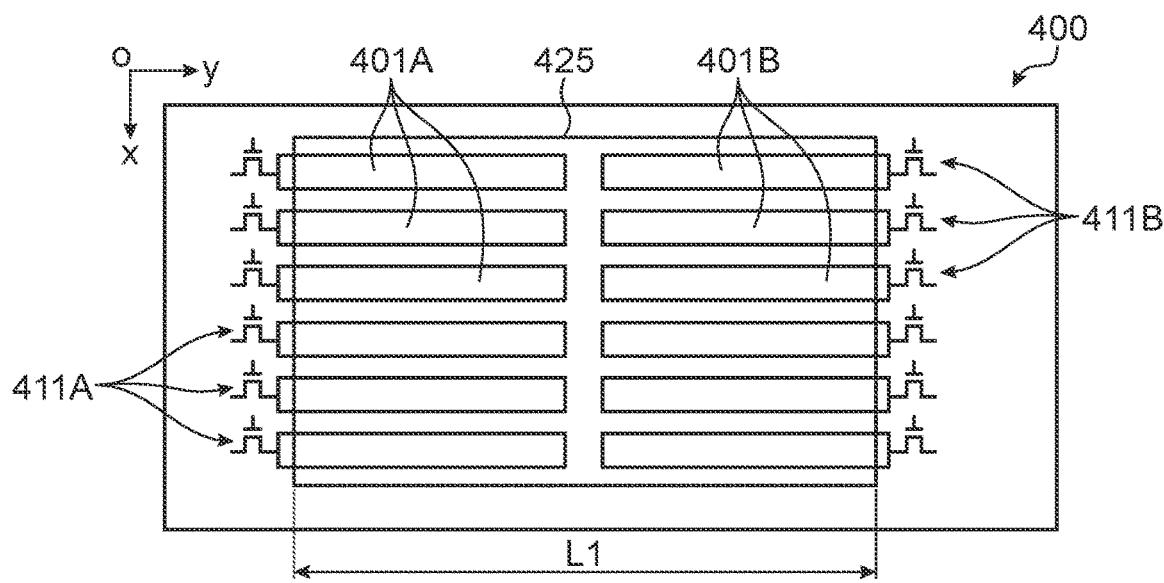
FIG. 4 shows a third embodiment of a papillary print sensor according to the invention.

FIG. 4 shows a third embodiment of a papillary print sensor according to the invention.

This embodiment will be described only for its differences in relation to the embodiment of FIGS. 1A to 1C.

According to this embodiment, the OLEDs are distributed into two series.

A first series of OLEDs 401A extends over the left portion of the fingerprint sensor 400.

It is comprised of OLEDs that each extend uninterruptedly over about half of the detecting surface 425 of the array optical sensor.

They extend in particular above said detecting surface, from the middle of the latter in the direction of the width L1, to the edge of this detecting surface and even beyond, in the example of FIG. 4.

This first series of OLEDs is controlled by control units 411A, arranged on the left edge of the substrate.

A second series of OLEDs 401B extends over the right portion of the fingerprint sensor 400.

The second series of OLEDs 401B is the symmetric of the first series of OLEDs 401A with respect to a plane parallel to (XOZ) passing through the middle of the detecting surface 425, in the direction of its width L1.

This second series of OLEDs 401B is controlled by control units 411B, arranged on the right edge of the substrate.

Each OLED 401A of the first series of OLEDs, and its symmetric 401B in the second series of OLEDs, are spaced apart by a distance that does not exceed one third of the width L1 of the detecting surface 425, preferably only a few micrometres.

Figure 5:
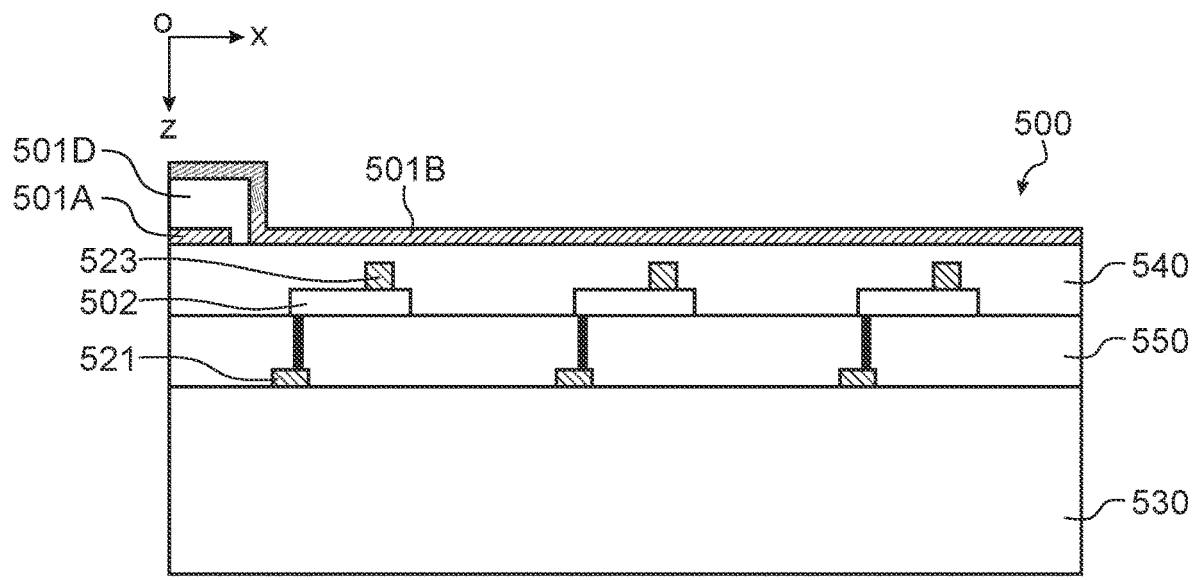
FIGS. 5 and 6 show two embodiments of a papillary print sensor according to the invention, comprising means for controlling the OLEDs.
Figure 6:
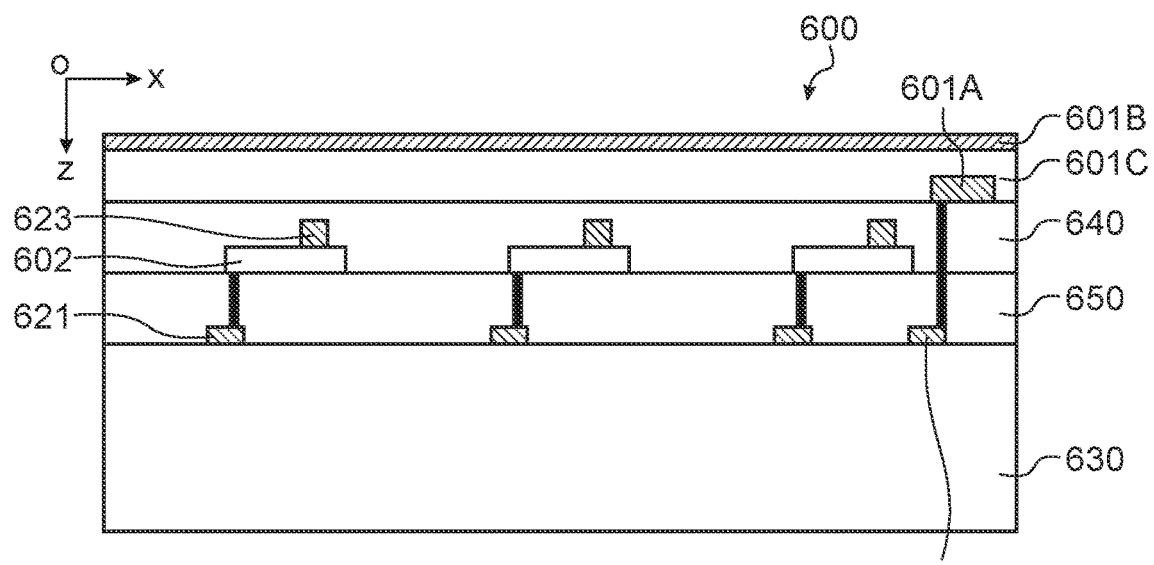

FIGS. 5 and 6 show two embodiments of a fingerprint sensor according to the invention, comprising means for controlling OLEDs, shown according to a cross-section view in a plane parallel to (XOZ).

Here are shown more particularly the control circuits of the OLEDs and of the photodetectors of the array optical sensor, produced using TFT technology, on a glass substrate 530.

The array optical sensor is comprised of photodetectors 502, here PiN diodes.

Each photodetector 502 is connected to a transistor 521, providing the reading then the reinitialising of the latter.

The transistors 521 are formed directly on the glass substrate 530, separated from the photodetectors by an insulation layer 550. A connection extends through this insulation layer in order to connect each transistor 521 to a photodetector 502.

Above each photodetector 502, in direct contact with the latter, a metal connector 523 makes it possible to polarise the latter.

The photodetector has an upper transparent electrode. The upper surface of each photodetector 502 forms a photosensitive area of the array optical sensor.

The whole is covered with a second insulation layer 540, which can be planarised before forming the OLEDs.

In the embodiment of FIG. 5, each OLED has a specific stack 501D of organic semiconductor layers.

An OLED is then defined by the intersection between a specific lower electrode 501A, the stack of organic semiconductor layers 501D, and the upper electrode 501B that is common to all the OLEDs.

The lower electrodes 501A are formed directly on the insulation layer 540.

Each stack 501D of organic semiconductor layers 501D is formed directly on a lower electrode 501A.

An upper electrode 501B covers the whole, extending both over the stacks 501D and over the insulation layer 540.

The lower electrodes 501A can be formed by deposition of a layer through a mask, or, in order to obtain smaller dimensions according to (OX), by deposition of a layer over the entire surface of the layer 540, then lithography and etching.

The stacks 501D can be carried out by deposition of a layer through a mask, for example a metal mask referred to as "shadow mask". The dimension of each stack 501D along the axis (OX) is less than 20 μm, even 10 μm.

The upper electrode 501B is arranged directly on the layer 540, or directly on the stacks 501D, where they are present.

According to an advantageous alternative, it is deposited through a mask, in the process, and in the same pumping as the deposition of the OLED.

In this configuration, the stacks 501D each extend above the array optical sensor, without covering the photodetectors 502. In other terms, they extend only between two rows of photodetectors 502.

In the example shown in FIG. 5, the repetition pitch of the OLEDs is greater than the pixel pitch, in such a way that a single OLED for three pixels of the array optical sensor has been shown.

In this way, they can be opaque without this disturbing the detection, by the photodetectors, of a signal emitted by the OLEDs and backscattered on human tissue that has a papillary print, for example a finger.

In the same way, the lower electrode 501A can be opaque, and reflective, in such a way that the OLEDs do not emit in the direction of the substrate 530.

The whole is covered with an encapsulation layer by thin film.

In this example, the means for controlling OLEDs are not integrated onto the substrate 530.

The electrodes are each connected to a metal connector arranged at the edge of the substrate, and a wired connection (not shown) connects these metal connectors to offset means for controlling.

Alternatively, transistors for controlling the OLEDs are integrated onto the edge of the substrate 530, off the detecting surface, as detailed hereinabove.

FIG. 6 shows an alternative of the embodiment of FIG. 5, which shall be described only for its differences in relation to FIG. 5. The numerical references of FIG. 6 correspond to the numerical references of FIG. 5, with the first digit replaced with a 6.

Here, the stack 601C of organic semiconductor layers is common to all the OLEDs, as shown in FIG. 3.

Each OLED is connected to a transistor 611 forming a control unit, and integrated onto the substrate 630. A connection extends through the insulation layer 650 in order to connect each transistor 611 to the lower electrode 601A of an OLED.

The transistors 611 are formed on the substrate 630, at the edge of the detecting surface.

Alternatively, although this would be not as interesting from the point of view of congestion as explained hereinabove, the transistors could also be arranged at the centre of the substrate.

Each OLED is advantageously monochrome, i.e. configured to emit light with a spectral width less than 80 nm, for example blue, red or green light.

At least two OLEDs can be configured to emit at respective wavelengths that are different from one another.

Figure 7A:
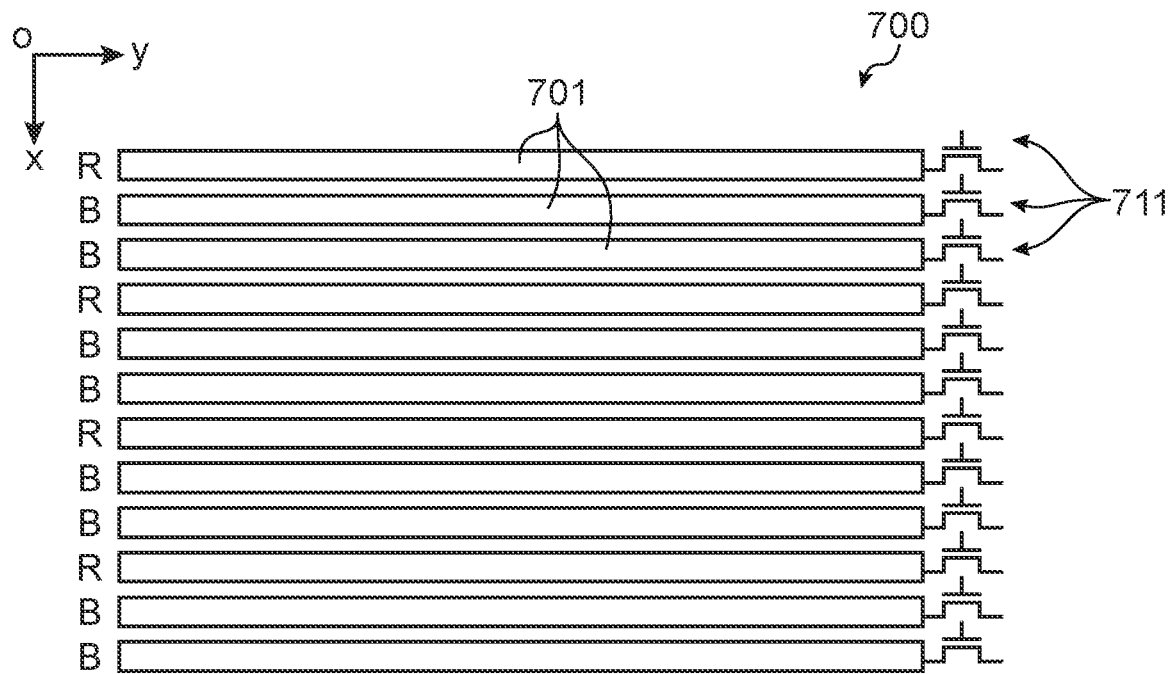
FIGS. 7A and 7B diagrammatically show two embodiments of a papillary print sensor according to the invention, having OLEDs of different types adapted to emit at different wavelengths.

FIG. 7A shows, according to a top view and diagrammatically, an example of a fingerprint sensor 700 wherein at least two OLEDs are configured to emit at respective wavelengths that are different from one another.

A first type of OLED, noted as B, is configured to emit blue light, at a wavelength between 400 and 495 nm.

A second type of OLED, noted as R, is configured to emit red light, at a wavelength between 620 and 750 nm.

It is as such possible to best characterise a sample that has a papillary print, by studying a radiation backscattered by this sample, and for several wavelengths located more preferably in the visible range. Indeed, the skin absorbs more or less according to the wavelength. Here, the two wavelengths chosen are located substantially at the two ends of the visible spectrum. More particularly, the absorption of living tissue (through the skin) has a substantial variation at the 600 nm wavelength. As such the consideration of a first and of a second type of OLEDs configured to emit light at wavelengths that are, respectively, less than and greater than 600 nm, makes it possible to consider the extraction of at least two substantially different pieces of information.

Since red light propagates further into living tissue, the OLEDs referred to as R, emitting red light, can be spaced farther apart from one another than the OLEDs referred to as B, emitting blue light.

In the example shown in FIG. 7A, all the OLEDs have the same dimensions and are regularly spaced apart from one another. The OLEDs together form a periodical arrangement, with a multi-spectral basic pattern comprising two OLEDs emitting blue light and one OLED emitting red light. As such, the average repetition pitch of an OLED emitting blue light is less than the average repetition pitch of an OLED emitting red light.

According to an alternative not shown, the various types of OLEDs, which differ through their emission wavelength, have an extent according to (OX) that depends on the central emission wavelength. The lower this wavelength is, the lower the extent according to OX is.

FIG. 7A also diagrammatically shows control units 711 that each comprise a transistor.

Figure 7B:
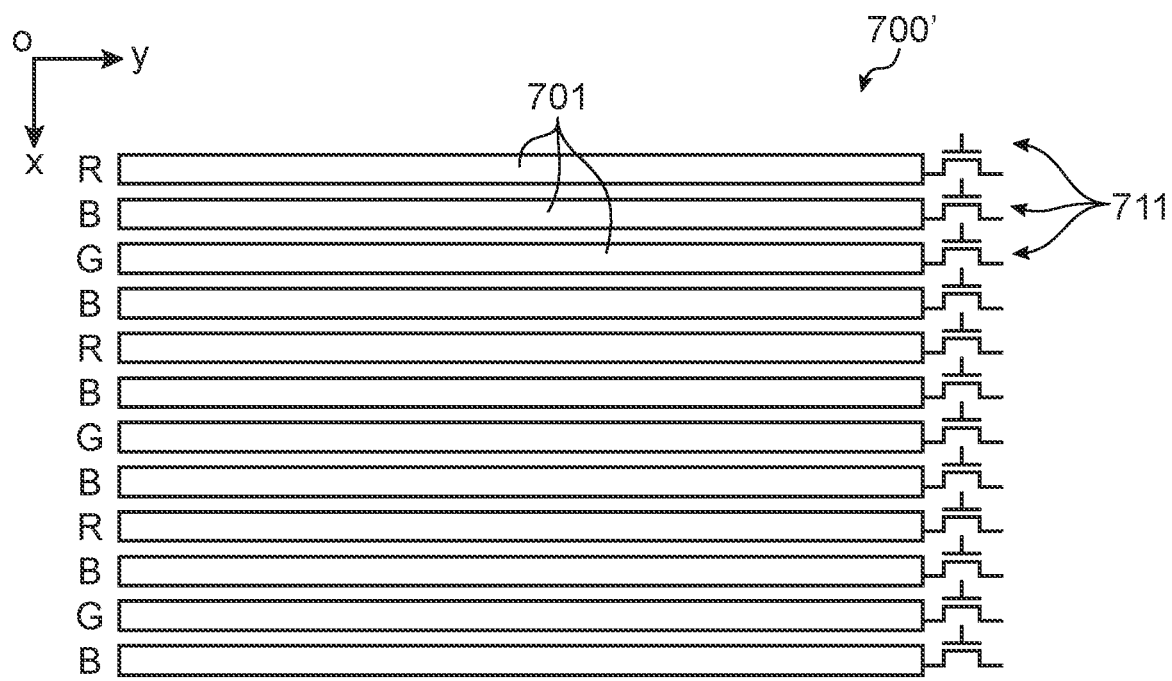

FIG. 7B shows an alternative wherein the fingerprint sensor 700' comprises illuminating means that have three types of OLEDs.

A first type of OLED, noted as B, is configured to emit blue light, at a wavelength between 400 and 495 nm.

A second type of OLED, noted as G, is configured to emit green light, at a wavelength between 495 and 570 nm, more particularly entre 500 and 570 nm.

A third type of OLED, noted as R, is configured to emit red light, at a wavelength between 620 and 750 nm.

The OLEDs that emit blue, green and red light together form a periodical arrangement, with a multi-spectral basic pattern comprising two OLEDs of the first type (emitting blue light), an OLED of the second type (emitting green light) and an OLED of the third type (emitting red light).

In particular, each OLED emitting blue light which is framed by two OLEDs, is framed by an OLED emitting red light and an OLED emitting green light.

As such, the repetition pitch of the OLEDs emitting blue light is here again lower than that of the other types of OLEDs (1 OLED out of 2 emitting blue light, one out of 4 emitting red light, one out of 4 emitting green light).

All sorts of alternatives can be imagined, in particular alternatives that comprise OLEDs emitting outside of the visible spectrum, for example in the near infrared (between 700 and 950 nm) or the near ultraviolet (between 350 and 440 nm).

Each OLED can be covered with a colour filter, in order to refine a wavelength emitted in the direction of the papillary print.

An extent of the basic patterns along the axis (OX) is preferably less than or equal to 10 mm, for example between 3 mm and 10 mm, even between 3 mm and 5 mm.

During operation, it is possible to light simultaneously only OLEDs that emit the same wavelength.

A scanning can be implemented in such a way that each OLED is lit exactly once and it extinguished otherwise. Alternatively, series of several OLEDs are lit simultaneously.

OLEDs of different colours can be carried out in different ways. For example, the emission wavelength of an OLED depends on the nature of the corresponding stack of organic semiconductor layers.

After having structured the lower electrodes, a successive deposition of the stacks of organic semiconductor layers of different natures is carried out, through different masks. For example, a deposition is carried out of a stack for the emission of blue light, by masking the lower electrodes dedicated to the emission of red and green light. Then, the mask is displaced and a deposition of a stack for the emission of red light is carried out, by masking the lower electrodes dedicated to the emission of blue and green light. The same is carried out for the emission of green light.

Alternatively, the emission wavelength of an OLED depends on the nature of a spectral filter that covers the upper electrode and that is an integral part of the OLED according to the invention.

For example, after having structured the lower electrodes, a deposition is carried out of a single stack of organic semiconductor layers for an emission of white light, and the whole is covered by the common upper electrode. Then, a deposition and an etching are carried out of the successive filtering layers facing the lower electrodes. This technique is very precise, and makes it possible to produce monochromatic OLEDs of only a few microns along (OX), with the OLED comprising the spectral filter that covers the upper electrode.

According to another alternative, the emission wavelength of an OLED depends on a supply voltage that is applied to it.

This alternative is adapted to produce two types of OLEDs. After having structured the lower electrodes, a deposition is carried out of a single stack of organic semiconductor layers that can have two central emission wavelengths, and the whole is covered by the common upper electrode. Then, each OLED will emit in one or the other wavelength according to the voltage applied to the corresponding lower electrode. For example, it will emit green at 3 V, and blue for a voltage greater than 4 V. This technique also makes it possible to produce OLEDs of only a few microns along (OX). The fingerprint sensor produced as such can be used to obtain an image of said print that has an improved quality, with respect to the images obtained according to prior art.

In particular, by lighting different combinations of OLEDs, a series of images is acquired that can be combined in order to overcome defects such as the effects of ambient light, a saturation of pixels, dirt on the fingerprint sensor, etc.

The fingerprint sensor according to the invention can also be used to discriminate a living tissue from an imitation, by calculating absorption and scattering coefficients of an imaged sample, from at least one image acquired for at least one lighting and extinguishing pattern of the OLED.

What is claimed is:

1. Papillary print sensor comprising in superposition, a contact surface to which the print to be imaged is intended to be applied, illuminating means and an array optical sensor, the array optical sensor comprising a plurality of photodetectors arranged in a square mesh with N rows and M columns, respectively, of a width and of a length, the width and the length defining, respectively, the width and the length of the detecting surface, wherein the illuminating means are arranged between said contact surface and a detecting surface of the array optical sensor, and consist of a plurality of organic light-emitting diodes, referred to as OLEDs, each OLED extending uninterruptedly over more than a third of the width of said detecting surface, and the OLEDs extending together according to one or two series of patterns that are parallel to one another and distributed over the length of the detecting surface, and a distance between the array optical sensor and the contact surface is less than 25 μm, wherein the illuminating means are formed of OLEDs of different types, which differ by the central wavelength of the light radiation that they are adapted to emit.

2. Sensor according to claim 1, wherein each OLED is connected to a control unit, arranged to control the lighting and the extinguishing of the OLED, an orthogonal projection of the control units in the plane of the detecting surface being located outside said detecting surface.

3. Sensor according to claim 1 wherein each OLED extending uninterruptedly over more than 90% of the width of said detecting surface, the OLEDs extending together according to a single series of patterns that are parallel to one another.

4. Sensor according to claim 1, wherein the OLEDs each comprise a spectral filter and together share the same organic semiconductor layer adapted to emit a multi-spectral radiation, and in that the different types of OLEDs differ by the central wavelength of the transmission band of the spectral filter.

5. Sensor according to claim 1, wherein each OLED has two separate central emission wavelengths, depending the value of a polarisation voltage that is applied to it, and in that the different types of OLEDs differ by the polarisation voltage supplied by a control unit connected to the OLED.

6. Sensor according to claim 1, wherein the organic light-emitting diodes comprise at least one first type of organic light-emitting diode, adapted to emit a light radiation with a central wavelength less than 590 nm, and a second type of organic light-emitting diode, adapted to emit a light radiation with a central wavelength greater than 600 nm.

7. Sensor according to claim 1, wherein the OLEDs comprise:
   a first type of OLED, adapted to emit a light radiation with a central wavelength between 400 and 495 nm,
   a second type of OLED, adapted to emit a light radiation with a central wavelength between 495 and 590 nm, and
   a third type of OLED, adapted to emit a light radiation with a central wavelength greater than 600 nm.

8. Sensor according to claim 1, wherein the OLEDs together form a periodical arrangement, with a basic pattern that comprises said several types of OLEDs.

9. Sensor according to claim 1, wherein the OLEDs together form a periodical arrangement, with a basic pattern such that the average repetition pitch of a type of OLED adapted to emit at a first wavelength is less than the average repetition pitch of a type of OLED adapted to emit at a second wavelength greater than the first wavelength.

10. Sensor according to claim 1, wherein each OLED has the form of a strip, with the OLEDs together forming strips parallel between them.

11. Sensor according to claim 1, wherein each OLED extends above the array optical sensor, without covering the photosensitive areas of the pixels of the array optical sensor.

12. Sensor according to claim 1, wherein the OLEDs are transparent and extend above the array optical sensor by covering the photosensitive areas of the pixels of said sensor.

13. Sensor according to claim 1, wherein the OLEDs are regularly distributed along the length of the detecting surface of the array optical sensor, with a repetition pitch equal to the pixel pitch of the array optical sensor along said length.

14. Papillary print sensor comprising in superposition, a contact surface to which the print to be imaged is intended to be applied, illuminating means and an array optical sensor, the array optical sensor comprising a plurality of photodetectors arranged in a square mesh with N rows and M columns, respectively, of a width and of a length, the width and the length defining, respectively, the width and the length of the detecting surface, wherein the illuminating means are arranged between said contact surface and a detecting surface of the array optical sensor, and consist of a plurality of organic light-emitting diodes, referred to as OLEDs, each OLED extending uninterruptedly over more than a third of the width of said detecting surface, and the OLEDs extending together according to one or two series of patterns that are parallel to one another and distributed over the length of the detecting surface, and a distance between the array optical sensor and the contact surface is less than 25 µm, wherein the OLEDs are transparent and extend above the array optical sensor by covering the photosensitive areas of the pixels of said sensor.

* * * * *

UNITED STATES PATENT AND TRADEMARK OFFICE
CERTIFICATE OF CORRECTION

| | | |
|---|---|---|
| PATENT NO. | : 10,719,685 B2 | Page 1 of 1 |
| APPLICATION NO. | : 16/064759 | |
| DATED | : July 21, 2020 | |
| INVENTOR(S) | : Jean-François Mainguet et al. | |

It is certified that error appears in the above-identified patent and that said Letters Patent is hereby corrected as shown below:

In the Specification

Column 7, Line 24, "electrode 1018, common" should be -- electrode 101B, common --.

Column 8, Line 19, "and PV" should be -- an P1' --.

Signed and Sealed this
Nineteenth Day of January, 2021

Andrei Iancu
*Director of the United States Patent and Trademark Office*